(12) United States Patent
Okumura et al.

(10) Patent No.: US 6,486,885 B2
(45) Date of Patent: Nov. 26, 2002

(54) MEMORY DEVICE AND METHOD

(75) Inventors: Akihiro Okumura, Kanagawa; Tetsujiro Kondo, Tokyo, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/000,908

(22) Filed: Nov. 15, 2001

(65) Prior Publication Data

US 2002/0054045 A1 May 9, 2002

Related U.S. Application Data

(63) Continuation of application No. 09/251,118, filed on Feb. 16, 1999, now abandoned.

(30) Foreign Application Priority Data

Feb. 16, 1998 (JP) .............................. 10-032913

(51) Int. Cl.⁷ .............................. G06F 12/06

(52) U.S. Cl. ...................... 345/573; 345/531

(58) Field of Search ................ 345/572, 573, 345/531, 536, 539, 561, 564, 501, 535, 98; 348/384.1, 387.1, 390.1; 367/901

(56) References Cited

U.S. PATENT DOCUMENTS

| 4,847,809 A | 7/1989 | Suzuki .................. 365/189.04 |
| 5,710,604 A | 1/1998 | Hodson et al. ............. 348/717 |
| 5,929,832 A | 7/1999 | Furukawa et al. ........... 345/98 |
| 6,067,120 A | 5/2000 | Horikawa et al. .......... 348/447 |
| 6,097,404 A | 8/2000 | Satoh et al. ................ 345/521 |

FOREIGN PATENT DOCUMENTS

FR            2 582 423        11/1986

*Primary Examiner*—Kee M. Tung
(74) *Attorney, Agent, or Firm*—Frommer Lawrence & Haug LLP; William S. Frommer; Joe H. Shallenburger

(57) ABSTRACT

A memory device for storing a sequential image data in succession and outputting the stored image data is provided. The memory device comprises a memory unit comprising N memory blocks, each memory blocks being capable of individual serving, a write address generator for generating a write address signal to write into the memory unit and a read address generator for generating a read address signal to read from the memory unit. The memory unit further comprises a controller for controlling the write address signal and the read address signal so that each start address for writing and reading for each image data is shifted as unit of the memory block and the writing and reading operation are not simultaneously performed to same memory block, each image data having a size being equivalent to one of M blocks (M<N).

14 Claims, 8 Drawing Sheets

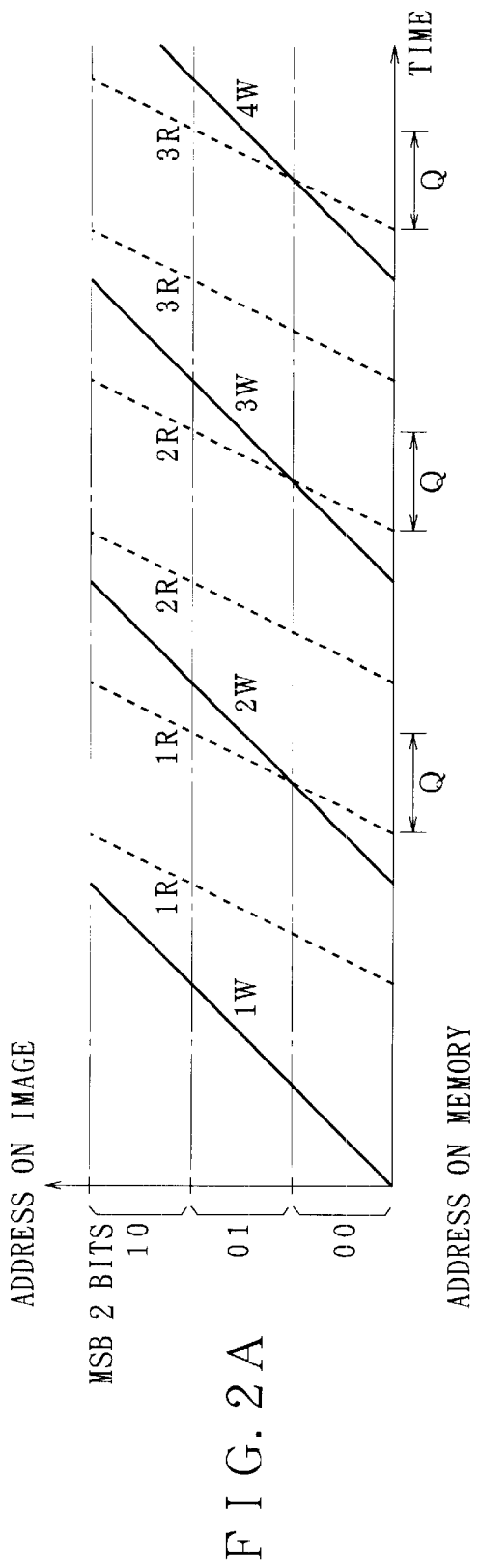
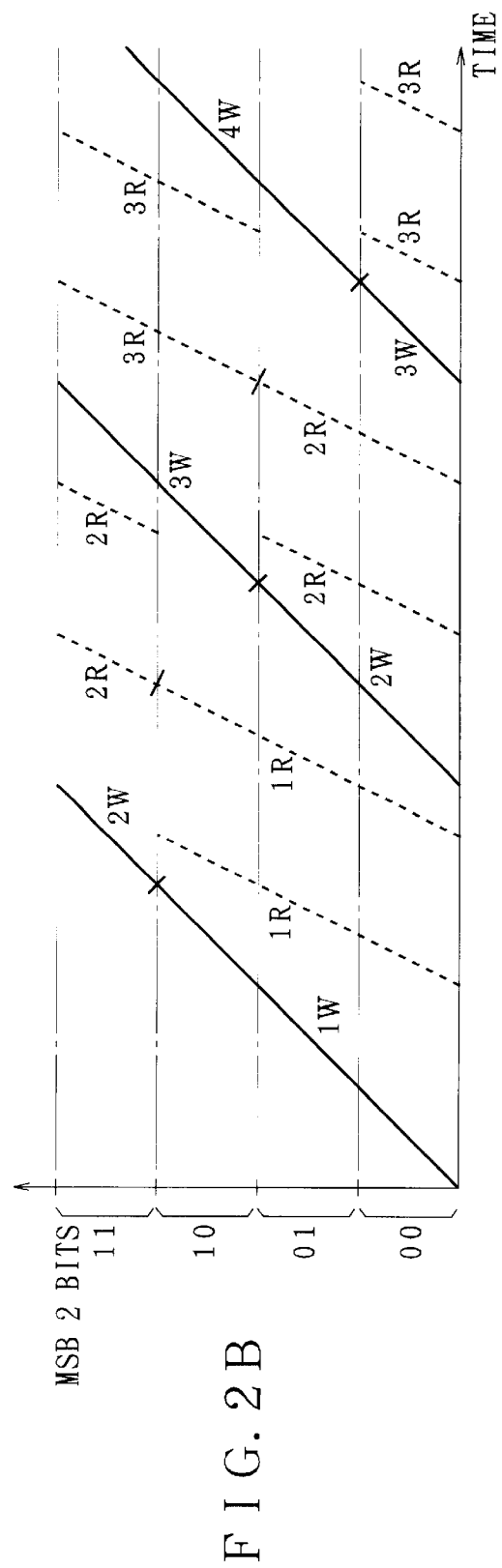
F I G. 2 A
F I G. 2 B

FIG. 3B

|  3BITS INPUT FROM PRINTER | 2BITS INPUT FROM COUNTER | 3BITS OUTPUT FROM LUT |
|---|---|---|
| 0 0 0 | 0 0 | 0 0 0 |
| 0 0 0 | 0 1 | 0 0 1 |
| 0 0 0 | 1 0 | 0 1 0 |
| 0 0 1 | 0 0 | 1 0 0 |
| 0 0 1 | 0 1 | 0 0 0 |
| 0 0 1 | 1 0 | 0 0 1 |
| 0 1 0 | 0 0 | 0 1 1 |
| 0 1 0 | 0 1 | 1 0 0 |
| 0 1 0 | 1 0 | 0 0 0 |
| 0 1 1 | 0 0 | 0 1 0 |
| 0 1 1 | 0 1 | 0 1 1 |
| 0 1 1 | 1 0 | 1 0 0 |
| 1 0 0 | 0 0 | 0 0 1 |
| 1 0 0 | 0 1 | 0 1 0 |
| 1 0 0 | 1 0 | 0 1 1 |

LUT

MEMORY DEVICE AND METHOD

This application is a continuation of Ser. No. 09/251,118 filed Feb. 2, 1999 now abandoned.

BACKGROUND OF THE INVENTION

This invention relates to a memory device suitable for application as an image memory. Specifically, this invention relates to a semiconductor memory device making it possible to implement two-port operations for writing and reading while restraining an increase in the area of a chip.

FIG. 6 shows an example of a configuration of a conventional image memory 100. The present image memory 100 has a DRAM (Dynamic Random Access Memory) 101, SRAMs (Static Random Access Memory) 102A and 102B, each used as a buffer memory disposed on the data input side (serial-in side). The memory 100 also has a serial Y decoder 103 for selecting write addresses for the SRAMs 102A and 102B, based on a Y-direction component of a write address signal, SRAMs 104A and 104B each used as a buffer memory disposed on the data output side (serial-out side), and a serial Y decoder 105 for selecting read addresses for the SRAMs 104A and 104B, based on a Y-direction component of a read address signal.

Now, the SRAMs 102A and 102B on the data input side are disposed as halves of an array of the DRAM 101 and alternately perform a transfer operation so that the writing of data can be made sequentially. Similarly, the SRAMs 104A and 104B on the data output side are also disposed as halves of the array of the DRAM 101 and alternately carry out a transfer operation so that the reading of data can be sequentially made.

Further, the image memory 100 includes an X decoder 106 for selecting an X-direction address (transfer address) related to writing or reading with respect to the DRAM 101, a write address counter 107 for generating a write address signal, a read address counter 108 for generating a read address signal, and an arbiter 109 used as an arbitration circuit for delaying write transfer when write and read transfer commands are brought into proximity with each other. In this case, the write transfer itself may be performed until the writing of data into the following SRAM (buffer memory) is completed, and there is sufficient lead-time to perform the write transfer.

For example, the image memory 100 shown in FIG. 6 is used to perform a flicker-free signal process for preventing screen's flicker (dazzling) with the number of screens as two, for example. FIG. 7 shows write and read address changes in the flicker-free signal process. In this case, respective video data (1W, 2W, etc.) constituting one filed or frame are successively written into the image memory 100. Further, respective video data (1R, 2R, etc.) are continuously read twice in succession from the image memory 100 at a speed twice the speed of writing.

According to the image memory 100 shown in FIG. 6, since there are provided the buffer memories 102A, 102B, 104A and 104B therein, two-port operations for writing and reading can be performed without any problem even when the write and read transfer commands are brought into connection with each other. However, since the buffer memories 102A, 102b, 104a and 104B are large in size, it is inconvenient since the chip area of the image memory 100 will increase.

In recent years, there may be many cases in which a memory of a megabit class is constructed so as to be divided into a plurality of memory blocks (MAT division) which serve as separate memories respectively, from the restrictions in circuit length of word and bit lines. In this case, when read and write operations are performed with predetermined memory blocks, non-accessed memory blocks are placed in an inactivated state.,

OBJECTS OF THE INVENTION

The present invention has been made in view of the above circumstances, and an object of this invention is to provide a memory device capable of implementing two-port operations for writing and reading while not increasing the chip area.

Another object of this invention is to provide a memory device capable of implementing a synchronous two-port operation for writing and reading without use of a buffer memory.

Another object of this invention is to provide a semiconductor memory device capable of effectively utilizing non-accessed inactive areas.

SUMMARY OF THE INVENTION

In order to attain the above objects, according to an aspect of the present invention, a memory device for storing a sequential image data in succession and outputting the stored image data is provided. The memory device comprises a memory unit comprising N memory blocks, each memory blocks being capable of individual serving, a write address generator for generating a write address signal to write read into the memory unit and a read address generator for generating a read address signal to read from the memory unit. The memory unit further comprises a controller for controlling the write address signal and the read address signal so that each start address for writing and reading for each image data is shifted as unit of the memory block and the writing and reading operation are not simultaneously performed to same memory block, each image data having a size being equivalent to one of M blocks (M<N).

Also, each image data represents an image data for one field or one frame. Further, the image data for one field or one frame, which is written into the memory unit is continuously read out twice at a speed twice the speed at writing. The image data for one field or one frame, which is written into the memory unit is continuously read out twice at a speed twice the speed at writing to perform a flicker-free signal processing.

The memory device further comprises an arithmetic circuit for performing a certain signal process by obtaining access to the memory block in the memory unit, which is free from the write and read operation. The arithmetic circuit performs noise reduction processing and receives a current image data from a input terminal and a previous image data from the memory block that is free from the write and read operation. The arithmetic circuit performs the noise reduction processing to the current image data by using the previous image data to produce a noise reduced current image data.

The controller further replaces a predetermined number of bits from a most significant bit of the read address signal with a predetermined number of revised bits for selecting a memory block to read out the image data and replaces a predetermined number of bits from a most significant bit of the write address signal with a predetermined number of revised bits for selecting a memory block to write the image data.

BRIEF DESCRIPTION OF THE DRAWINGS

For a more complete understanding of the invention, reference is made to the following description and accompanying drawings, in which:

FIGS. 2A and 2B are diagrams illustrating address changes at the time of flicker-free signal processing for explaining the first embodiment;

FIG. 3B is a table showing the look up table;

DESCRIPTION OF THE PREFERRED EMBODIMENTS

Figure 1:
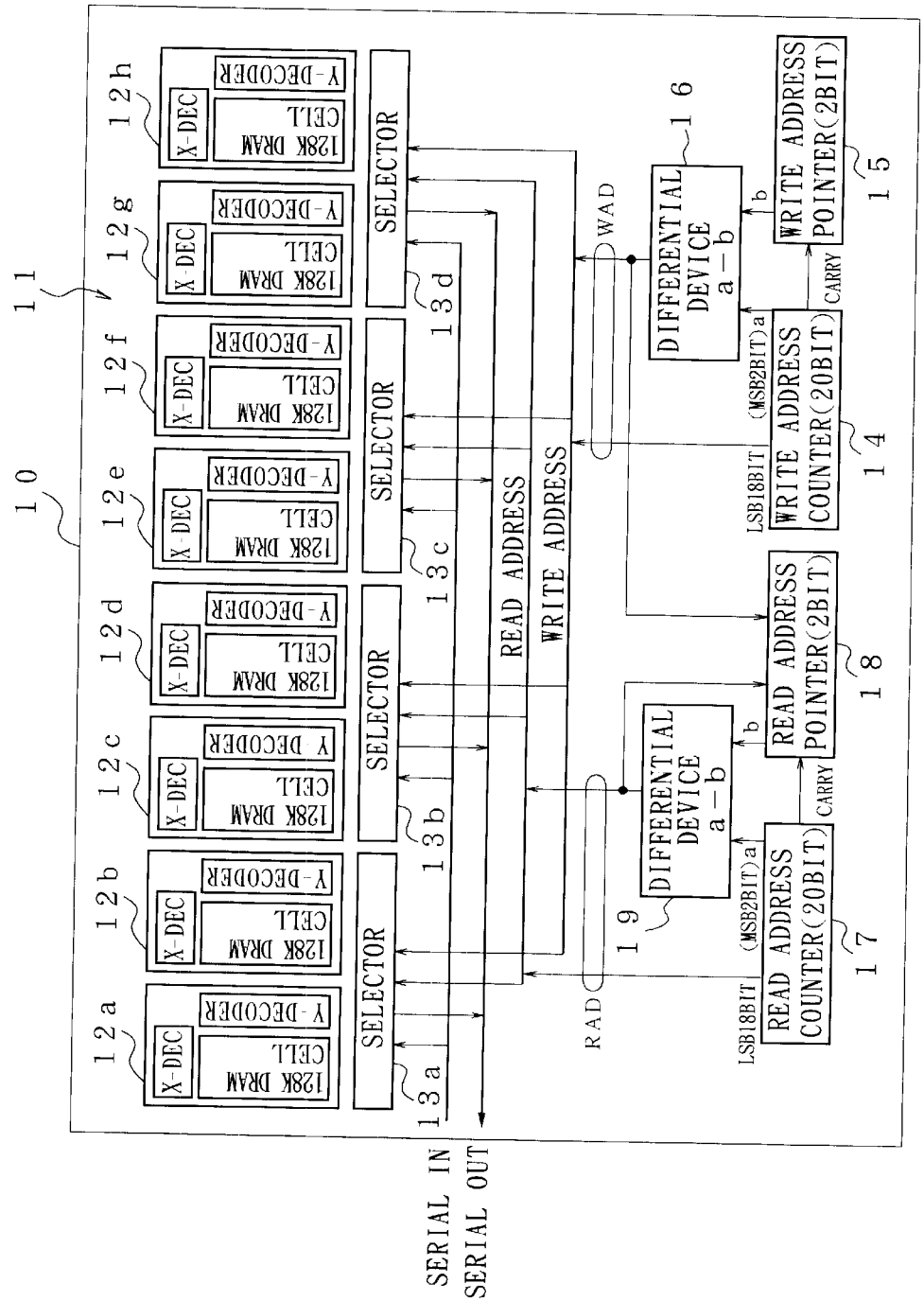
FIG. 1 is a block diagram showing a configuration of a semiconductor memory device used as a first embodiment.

A first embodiment of the present invention will hereinafter be described with reference to the accompanying drawings. FIG. 1 shows a configuration of a semiconductor memory device 10 used as the first embodiment. As the first embodiment the present semiconductor memory device 10 is one for implementing synchronous two-port operations without having to use a buffer memory, and is also intended for execution of a flicker-free signal process for preventing screen flicker with the number of screens as two.

The memory device 10 has a memory unit 11 comprised of eight memory blocks (DRAM arrays) 12a through 12h which serve as separate memories, respectively. The memory blocks 12a through 12h are constructed so as to have 128K DRAMs, X decoders for selecting addresses in X directions of the DRAMs and Y decoders for selecting addresses in Y directions of the DRAMs, respectively. In this case, video data per field or frame will be equivalent to six data in each memory block.

Further, the memory device 10 includes four selectors 13a through 13d for selecting the memory blocks 12a through 12h as write or read objects. In this case, the selectors 13a through 13d are constructed to select two memory blocks as pairs. The selector 13a selects the memory blocks 12a and 12b in a pair, the selector 13b selects the memory blocks 12c and 12d in a pair, the selector 13c selects the memory blocks 12e an d 12f in a pair, and the selector 13d selects the memory blocks 12g and 12h in a pair. Thus, the selection of the two memory blocks in each pair by each of the selectors 13a through 13d is made to allow a continuous serial operation according to bank switching.

The memory device 10 includes a write address counter 14 for generating a 20-bit write address signal, a write address pointer 15 which counts up in response to a carry signal outputted from the write address counter 14 and outputs a two-bit signal therefrom, and a differential device 16 for subtracting the 2-bit signal outputted from the pointer 15 from a high-order two-bit signal (MSB (most significant bit) and second bit from the MSB) of the write address signal generated from the write address counter 14.

In this case, the high-order two-bit signal of the 20-bit write address signal generated from the counter 14 is replaced by the two-bit signal outputted from the differential device 16, so that a write address signal WAD for the memory unit 11 is produced or formed. In this case, a pair of memory blocks to perform writing is selected based on the high-order two bits (MSB and second bit from the MSB) of the write address signal WAD.

The memory device 10 has a read address counter 17 for generating a 20-bit read address signal, a read address pointer 18 which counts up according to a carry signal outputted from the read address counter 17 and outputs a two-bit signal therefrom, and a differential device 19 for subtracting the two-bit signal outputted from the pointer 18 from a high-order two-bit signal (MSB (most significant bit) and second bit from the MSB) of the read address signal produced from the read address counter 17.

In this case, the high-order two-bit signal of the read address signal generated from the counter 17 is replaced by the two-bit signal outputted from the differential device 19 so that a read address signal RAD for the memory unit 11 is formed. In this case, a pair of memory blocks to perform reading is selected based on the high-order two bits (MSB and second bit from the MSB) of the read address signal RAD.

The count speed, i.e., read speed of the counter 17 is set to twice the count speed, i.e., write speed of the counter 14 to perform the flicker-free signal process with the number of screens as twice. Only when the high-order two-bit signal of the read address signal RAD to be described later, i.e., a two-bit signal obtained by adding 1 to the two-bit signal outputted from the differential device 19 is not equal to the high-order two-bit signal of the write address signal WAD, i.e., the two-bit signal outputted from the differential device 16, the pointer 18 is counted up according to the carry signal outputted from the counter 17. Thus, a read start address is varied every twice readings and video data for the same one field or frame can be continuously read.

The operation of the memory device 10 will next be explained with reference to FIGS. 2A and 2B. FIG. 2A shows address on image. Each solid line in FIG. 2A indicates a change in write address on the image and each broken line in FIG. 2A indicates a change in read address on the image. That is, the write address corresponds to a write address signal generated from the counter 14, and the read address corresponds to a read address' signal generated from the counter 17. In FIGS. 2A and 2B, 1W, 2W and 3W respectively indicate video data for one field or frame related to writing, and 1R, 2R and 3R indicate video data for one field or frame related to reading and correspond to the aforementioned video data 1W, 2W and 3W. . . , respectively.

When the write address and the read address on the image are used as they are, their high-order two-bit signals respectively change like [00]→[01]→[10]'[00]'[01]'. . . , and only the pair of memory blocks 12a and 12b, the pair of memory blocks 12c and 12d and the pair of memory blocks 12e and 12f are used for writing and reading. Since the writing and reading are simultaneously performed with the pair of the same memory blocks in a range of Q, the two-port operations for writing and reading cannot be realized.

In the present invention, addresses for writing and reading on memory are adopted as shown in FIG. 2B. FIG. 2B shows address for writing and reading on memory. Each solid line in FIG. 2B indicates a change in write address on the memory, and each broken line in FIG. 2B indicates a change in read address on the memory. The writing address corresponds to a write address signal WAD and the read address corresponds to a read address signal RAD in FIG. 1. In this case, the high-order two-bit signal of the write address signal WAD changes as in the case of [00]→[01]→[10] in relation to the video data 1W, and the video data 1W is successively written into the pair of memory blocks 12a and 12b, the pair of memory blocks 12c and 12d and the pair of memory blocks 12e and 12f. Further, the high-order two-bit signal of the read address signal RAD changes as in the case of ⌈00⌉→⌈01⌉→⌈10⌉→⌈00⌉→⌈01⌉→⌈10⌉ in relation to the video data 1R, and the video data 1R is sequentially read twice at a speed twice the speed at writing from the pair of memory blocks 12a and 12b, the pair of memory blocks 12c and 12d and the pair of memory blocks 12e and 12f.

Next, the high-order two-bit signal of the write address signal WAD changes as in the case of ⌈11⌉→⌈00⌉→⌈01⌉ in relation to the video data 2W following the video data 1W, and the video data 2W is sequentially written into the pair of memory blocks 12g and 12h, the pair of memory blocks 12a and 12b and the pair of memory blocks 12c and 12d. Further, the high-order two-bit signal of the read address signal RAD changes as in the case of ⌈11⌉→⌈00⌉→⌈01⌉→⌈11⌉→⌈00⌉→⌈01⌉ in relation to the video data 2R, and the video data 2R is continuously read twice from the pair of memory blocks 12g and 12h, the pair of memory blocks 12a and 12b and the pair of memory blocks 12c and 12d at a speed twice the speed at writing.

When the write and read operations are performed below in the same manner as described above and the normal video data is supplied from the data input side (serial-in side), video data for setting the number of screens twice to prevent screen's flicker is obtained on the data output side (serial-out side).

In the first embodiment as has been described above, the write and read start addresses are successively shifted to thereby prevent the writing and reading simultaneously performed with the pair of the same memory blocks, and the two-port operations for writing and reading are realized. Thus, the present embodiment does not use a large buffer memory and is capable of restraining an increase in the area of a chip.

Figure 3A:
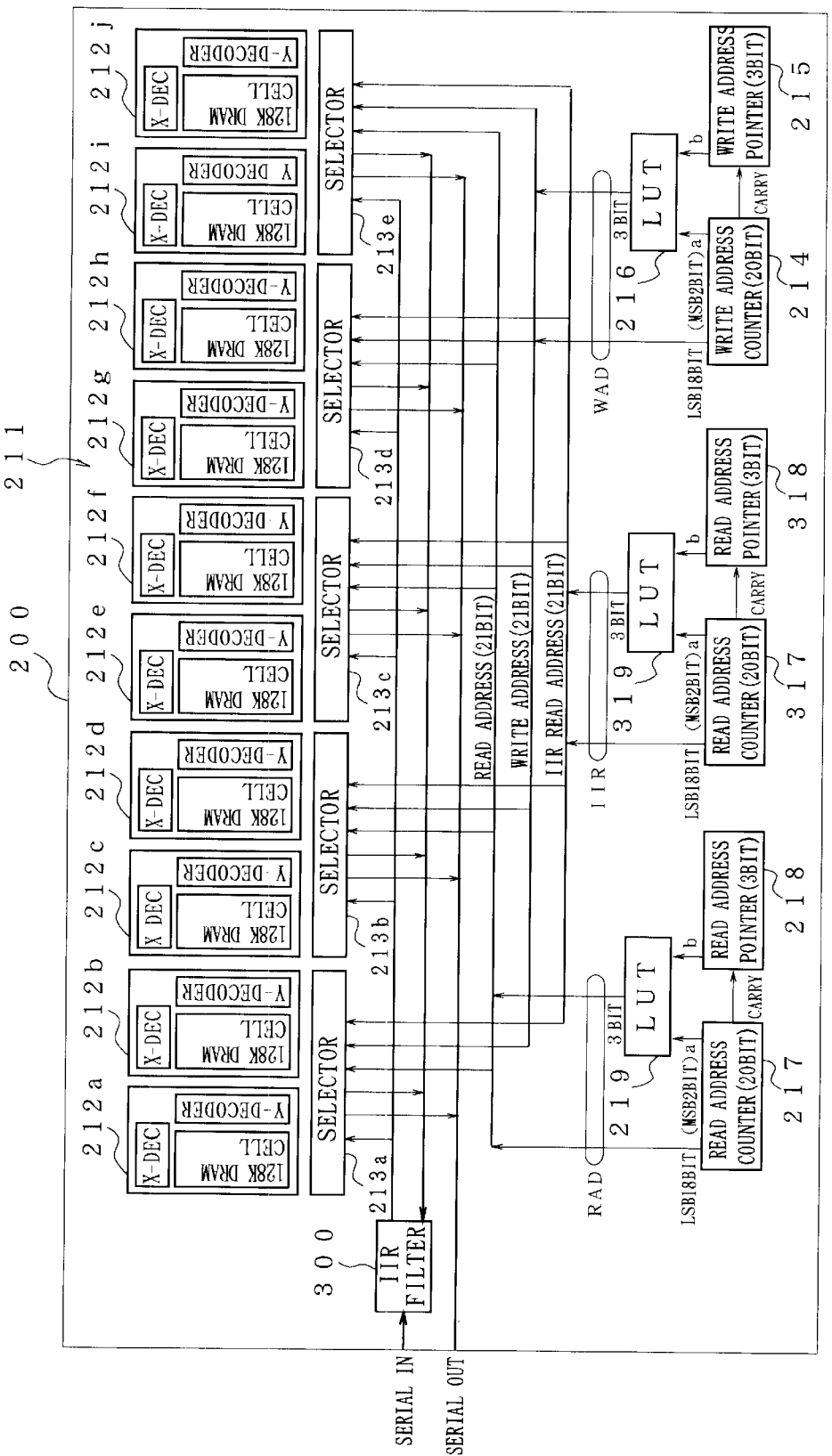
FIG. 3A is a block diagram showing a configuration of a semiconductor memory device used as a second embodiment.

FIG. 3A shows a semiconductor memory device 200 used as a second embodiment of the present invention. The present memory device 200 is one wherein synchronous two-port operations are implemented without having to use a buffer memory. More especially, the memory device 200 performs noise-reduction signal processing by accessing to a memory block free from write and read operations.

As the second embodiment the present semiconductor memory device 200 is one for implementing synchronous two-port operations without having to use a buffer memory, and is also intended for execution of a noise-reduction signal process utilizing non-accessed inactive areas.

The memory device 200 has a memory unit 211 comprised of ten memory blocks (DRAM arrays) 212a through 12j which serve as separate memories, respectively. The memory blocks 212 through 212j are constructed so as to have 128K DRAMs, X decoders for selecting addresses in X directions of the DRAMs and Y decoders for selecting addresses in Y directions of the DRAMs, respectively. In this case, video data per field or frame will be equivalent to six data in each memory block.

Further, the memory device 200 includes five selectors 213a through 213e for selecting the memory blocks 212a through 212j as write or read objects. In this case, the selectors 213a through 213e are constructed so as to select two memory blocks as pairs. The selector 213a selects the memory blocks 212a and 212b in a pair, and so on. Thus, the selection of the two memory blocks in each pair by each of the selectors 213a through 213e is made to allow a continuous serial operation according to bank switching.

The memory device 200 includes a write address counter 214 for generating a 20-bit write address signal, a write address pointer 215 which counts up in response to a carry signal outputted from the write address counter 214 and outputs a three-bit signal therefrom, and a look up table 216 for converting the three-bit signal outputted from the pointer 215 and a high-order two-bit signal (MSB (most significant bit) and second bit from the MSB) of the write address signal generated from the write address counter 214 into a three-bit output.

In this case, the high-order two-bit signal of the 20-bit write address signal generated from the counter 214 is replaced by the three-bit signal outputted from the look up table 216, so that a write address signal WAD for the memory unit 211 is produced or formed. In this case, a pair of memory blocks to perform writing is selected based on the high-order three bits (MSB, second bit and third bit from the MSB) of the write address signal WAD.

The memory device 200 has a read address counter 217 for generating a 20-bit read address signal, a read address pointer 218 which counts up according to a carry signal outputted from the read address counter 217 and outputs a three-bit signal therefrom, and a look up table 219 for converting the three-bit signal outputted from the pointer 218 and a high-order two-bit signal (MSB (most significant bit) and second bit from the MSB) of the read address signal produced from the read address counter 217 into a three-bit output.

In this case, the high-order two-bit signal of the read address signal generated from the counter 217 is replaced by the three-bit signal outputted from the look up table 219 so that a read address signal RAD for the memory unit 211 is formed. In this case, a pair of memory blocks to perform reading is selected based on the high-order three bits (MSB, second bit and third bit from the MSB) of the read address signal RAD.

The memory device 200 also has an IIR read address counter 317 for generating a 20-bit read address signal, an IIR read address pointer 318 which counts up according to a carry signal outputted from the IIR read address counter 317 and outputs a three-bit signal therefrom, and an IIR look up table 319 for converting the three-bit signal outputted from the pointer 318 and a high-order two-bit signal (MSB (most significant bit) and second bit from the MSB) of the read address signal produced from the read address counter 317. These work as previously described above and allow the IIR (Infinite Impulse Response) filter circuit 300 to access the memory unit 211.

The IIR filter circuit 300 successively obtains access to memory blocks 211 to obtain input video data and video data produced by delaying the input video data by one field or frame, thereby performing a noise-reduction process. Further, the IIR filter circuit writes the noise-eliminated video data into each memory block in place of the aforementioned input video data.

FIG. 3B shows the look up tables 216, 219 and 319. The left most three columns show the input from the three-bit input from the pointers 215, 218 and 318. The middle two columns show the two-bit input from the counters 214, 217 and 317. The right three columns show the three-bit output from the look up tables 216, 219 and 319.

Figure 4:
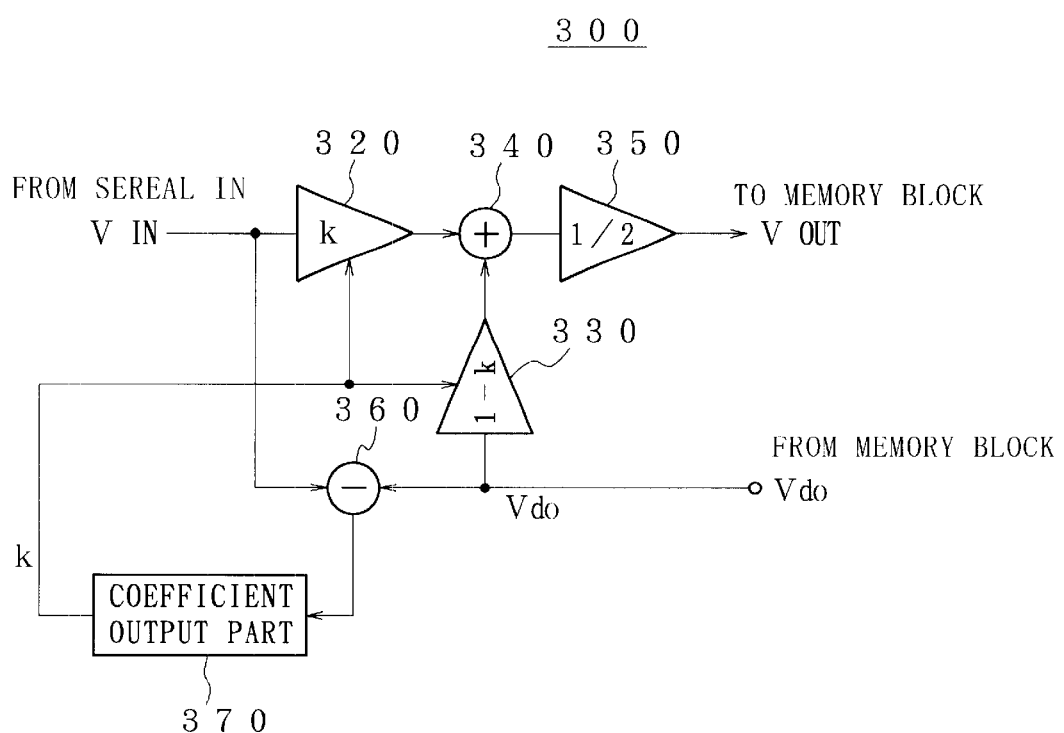
FIG. 4 is a block diagram of the IIR filter.

FIG. 4 shows a configuration of a conventional known IIR-type noise-reduction circuit 300. The noise-reduction circuit 300 comprises a coefficient multiplier 320 for multiplying input video data Vin by a coefficient k, a coefficient multiplier 330 for multiplying video data Vdo located ahead by one field or frame, which is outputted from the memory block 211, by a coefficient 1-k, an adder 340 and a coefficient multiplier 350 for adding and averaging output video data of the coefficient multipliers 320 and 330 to thereby obtain output video data Vout in which noise is eliminated, and a subtractor 360 and a coefficient output circuit 370 for making subtracting between the input video data Vin and the video data Vdo outputted from the memory block 211 and obtaining a coefficient k (0<k<1) corresponding to motion according to a signal indicative of its subtraction. The output video data is output as noise-eliminated video data to store in the memory unit 211.

Referring back to FIG. 3A, the IIR filter circuit 300 performs noise-reduction processing to obtain noise-eliminated output video data Vout. In this case, the IIR filter circuit 300 does not need to have a memory. Namely, the IIR filter circuit 300 obtains access to the memory blocks constituting the memory unit 211 to thereby obtain input video data Vin and output video data Vdo located ahead by one field. Incidentally, the processing of noise reduction by the IIR filter circuit 300 is performed before the reading of video data in which noise has not been eliminated.

Figure 5A:
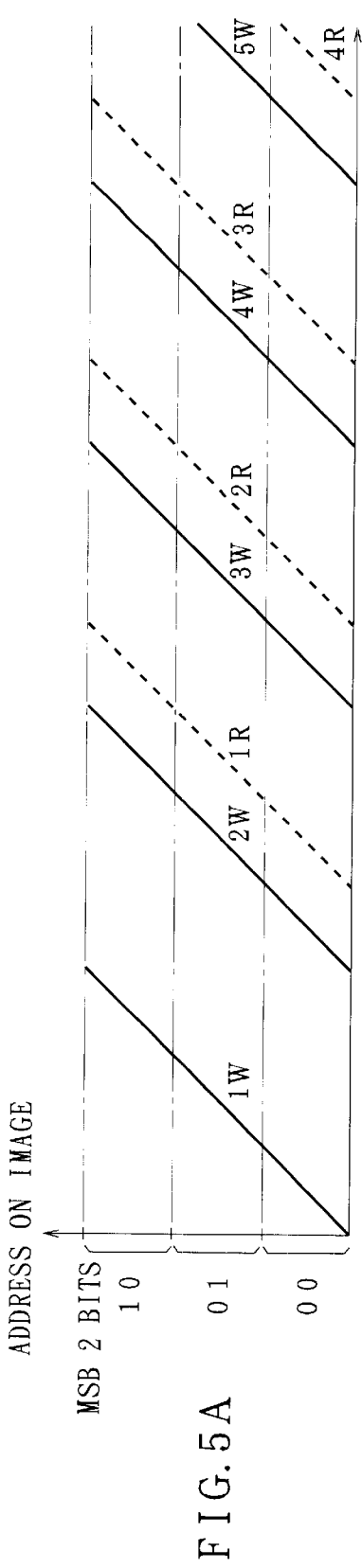
FIGS. 5A and 5B are diagrams illustrating address changes at the time of IIR filter processing for explaining the second embodiment.
Figure 5B:
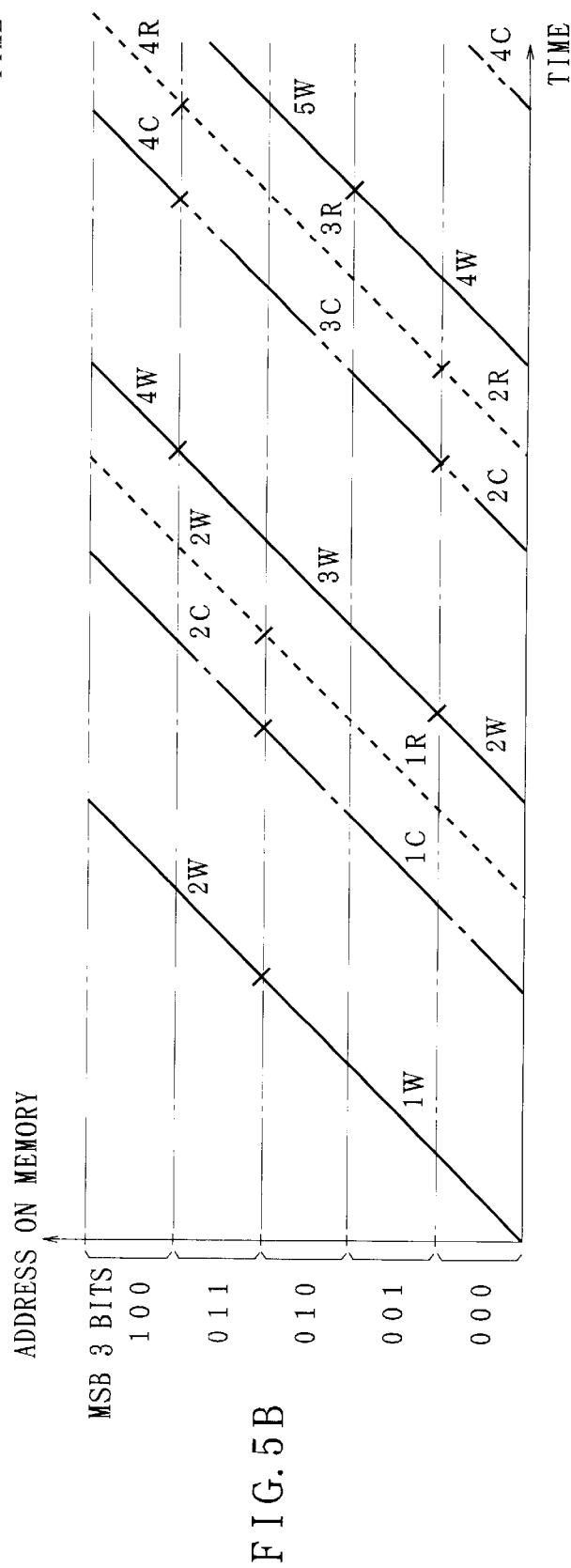
Figure 6:
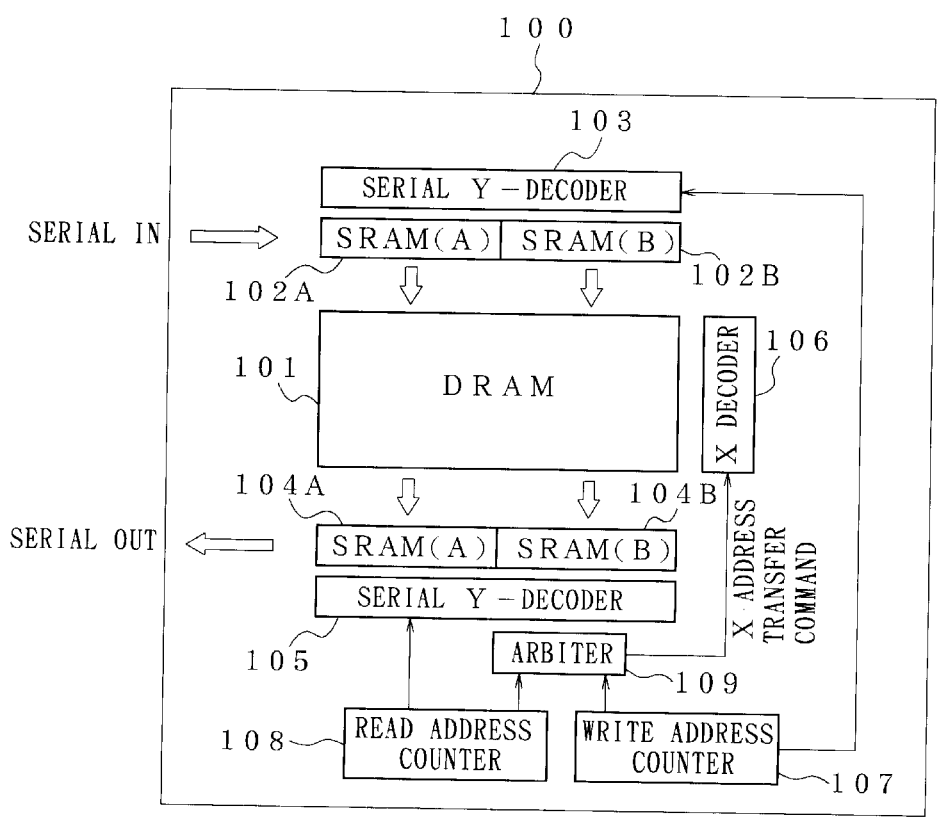
FIG. 6 is a block diagram depicting one example of a configuration of a conventional image memory.
Figure 7:
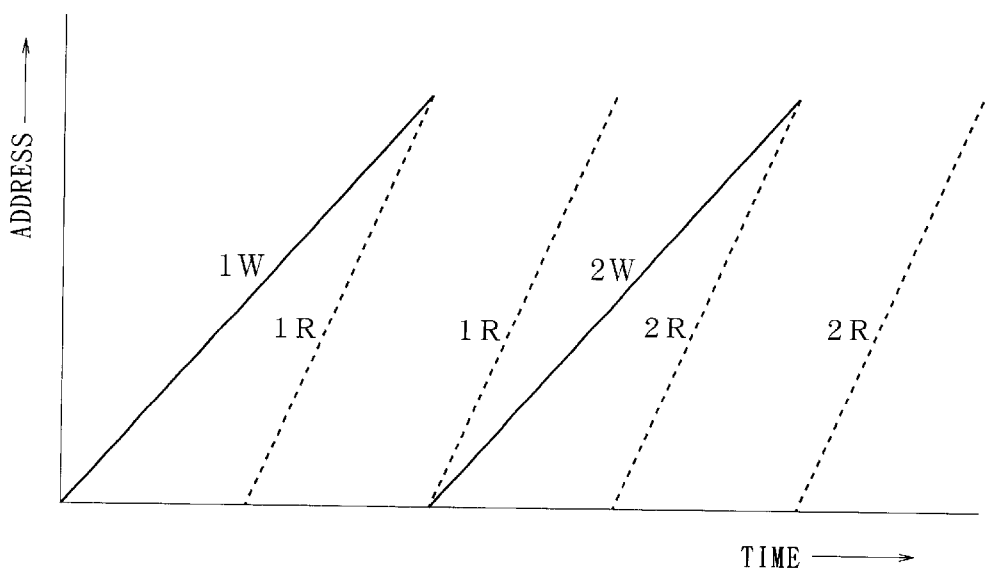
FIG. 7 is a diagram showing address changes at the time of flicker-free signal processing executed using the conventional image memory.

The operation of the memory device 200 will next be explained with reference to FIGS. 5A and 5B. FIG. 5A shows address on image. Each solid line in FIG. 5A indicates a change in write address on the image and each broken line in FIG. 5A indicates a change in read address on the image. The write address corresponds to a write address signal generated from the counter 214, and the read address shown by broken line corresponds to a read address signal generated from the counter 217. Also, the counter 317 generates a read address signal IIR as each hatched line as shown in FIG. 5B. In FIGS. 5A and 5B, 1W, 2W and 3W, . . . respectively indicate video data for one field or frame related to writing, and 1R, 2R and 3R, . . . indicate video data for one field or frame related to reading and correspond to the aforementioned video data 1W (1C), 2W (2C) and 3W (3C) . . . , respectively. Also 1C, 2C and 3C indicate video data for one field or frame related to reading and corresponding to the aforementioned video data 1W, 2W and 3W, respectively.

In this case, a high-order three-bit signal of the write address signal WAD changes as in the case of ⌈000⌉→⌈001⌉→⌈010⌉→. . . , in relation to the video data 1W, and the video data 1W is successively written into the pair of memory blocks 212a and 212b, the pair of memory blocks 212c and 212d and so on without noise-reduction processing, because the previous video data does not exist in memory units 211. Further, the high-order three-bit signal of the read address signal RAD changes as in the case of ⌈000⌉→⌈001⌉→⌈010⌉ in relation to the video data 1C, and the video data 1C is sequentially read to provide to provide to the IIR filter circuit 300 from the pair of memory blocks 212a and 212b, the pair of memory blocks 212c and 212d and the pair of memory blocks 212e and 212f.

And then, at IIR filter circuit 300. Noise reduction processing is performed to the input video data 2W following the video data 1W by using video data 1C from memory unit 211 and noise-eliminated video data 2W is output from the IIR filter circuit 300. In this case, the video data written into the memory unit 211 are replaced by video data(output video data Vout) which has been noise-eliminated by IIR filter circuit 300. At the same time, the high-order three-bit signal of the write address signal WAD changes as in the case of ⌈011⌉→⌈100 →⌈000⌉ in relation to the noise-eliminated video data 2W following the video data 1W. The noise-eliminated video data 2W is sequentially written into the pair of memory blocks 212g and 212h, the pair of memory blocks 212i and 212j and the pair of memory blocks 212a and 212b.

Further the high-order three-bit signal of the read address signal RAD changes as in the case of ⌈000⌉→⌈001⌉→⌈010⌉ in relation to the video data 1R, and the video data 1R is continuously read from the pair of memory blocks 212a 212b, the pair of memory blocks 212c and 212d and the pair of memory blocks 212e and 212f to output from the memory device 200.

Next, the high-order three-bit signal of the read address signal IIR changes as in the case of ⌈011⌉→⌈100⌉→⌈000⌉ in relation to the noise-eliminated video data 2C and the noise-eliminated video data 2C is sequentially read to provide to the IIR filter circuit 300 from the pair of memory blocks 212g and 212h, the pair of memory blocks 212I and 212j and 212a and 212b.

Then, at IIR filter circuit 300, noise reduction processing is performed to input video data 3W following the video data by using video data 2C from the memory unit 211 and noise-eliminated video data 3W is output from the IIR filter circuit 300. In this case, the video data written into the memory unit 211 is replaced by video data (output video data Vout) which has been noise-eliminated by IIR filter circuit 300. At same time, the high-order three-bit signal of the write address signal WAD changes as in the case of ⌈011⌉-⌈100⌉→⌈000⌉ in relation to the noise-eliminated video data 2R, and the noise-eliminated video data 2R is continuously read from the pair of memory blocks 212g and 212h, the pair of memory blocks 212i and 212j and the pair of memory blocks 212a and 212b to output from the memory device 200.

When the write and read operations are performed in the same manner as described above and the normal video data is supplied from the data input side (serial-in side), the noise-eliminated video data is obtained on the data output side (serial out side). The video data obtained on the data output side results in one subjected to the noise-reduction processing.

In the second embodiment as has been described above, the write and read start addresses are successively shifted so that the writing and reading are not simultaneously performed with the pair of the same memory blocks, and the two-port operations for writing and reading are realized. Thus, the present embodiment does not use a large buffer memory and is capable of restraining an increase in the area of a chip in a manner similar to the first embodiment. Further, the IIR filter 300 obtains access to the memory blocks non-subjected to the write and read operations to thereby perform the noise-reduction signal processing. Thus, non-accessed inactive memory areas can be utilized effectively.

Although the IIR filter circuit 300 for performing the noise-reduction process is provided in the aforementioned second embodiment, an IIR may be provided which obtains access to memory blocks non-subjected to write and read operations to obtain predetermined video data, thereby performing other processes. For example, a resolution creating process (see Japanese Patent Application Hei 6-205934) for converting NTSC video data to high-definition television video data, a progressive converting process for converting interlaced video data to non-interlaced video data, a motion vector detecting process for MPEG (Moving Picture Experts Group), etc. can be applied as other processes.

According to the present invention, a memory unit comprises N memory blocks that respectively function as separate memories. When data with M (M<N) data as units in the memory blocks are sequentially written into the memory unit and continuously read therefrom, write and read start addresses are shifted every units described above with the memory blocks as units so that writing and reading are not simultaneously performed with the same memory block. Thus, two-port operations for writing and reading can be implemented while an increase in the area of a chip is being restrained.

Also, according to the present invention, two-port operations for writing and reading can be implemented without buffer memorys. Thus, it is possible to realize in small size of chip.

Further, according to the present invention, a memory unit comprises a plurality of memory blocks which respectively serve as separate memories, and an arithmetic circuit for obtaining access to the memory blocks free from write and read operations to thereby perform signal processing is provided. Thus, a profit is brought about in that non-accessed interactive areas can be effectively utilized.

Having now fully described the invention, it will be apparent to one of ordinary skill in the art that many changes and modifications can be made thereto without departing from the spirit and scope of the invention as set forth herein.

What is claimed is:

1. A memory device for storing a sequential image data in succession and outputting the stored image data, comprising:
    a memory unit comprising N memory blocks, each memory blocks being capable of individual serving;
    a write address generator for generating a write address signal to write into the memory unit;
    a read address generator for generating a read address signal to read from the memory unit; and
    a controller for controlling the write address signal and the read address signal so that each start address for writing and reading for each image data is shifted as unit of the memory block and the writing and reading operation are not simultaneously performed to same memory block, each image data having a size being equivalent to one of M blocks (M<N),
    wherein said controller replaces a predetermined number of bits from a most significant bit of the read address signal with a predetermined number of revised bits for selecting a memory block to read out the image data and replaces a predetermined number of bits from a most significant bit of the write address signal with a predetermined number of revised bits for selecting a memory block to write the image data.

2. A memory device according to claim 1, wherein each image data represents an image data for one field or one frame.

3. A memory device according to claim 2, wherein the image data for one field or one frame, which is written into the memory unit is continuously read two times at a speed twice the speed at writing.

4. A memory device according to claim 3, wherein the image data for one field or one frame, which is written into the memory unit is continuously read two times at a speed twice the speed at writing to perform a flicker-free signal processing.

5. A memory device according to claim 2, further comprising:
    arithmetic circuit for performing a certain signal process by obtaining access to the memory block in said memory unit, which is free from said write and read operation.

6. A memory device according to claim 5, wherein said arithmetic circuit performs noise reduction processing.

7. A memory device according to claim 6, wherein said arithmetic circuit receives a current image data from a input terminal and a previous image data from said memory block which is free from said write and read operation, perform said noise reduction processing to said current image data by using said previous image data to produce a noise reduced current image data.

8. A method for storing a sequential image data in a memory device in succession and outputting the stored image data from the memory device, comprising the steps of:
    generating a write address signal to write into a memory unit, said memory unit comprising N memory blocks, each memory blocks being capable of individual serving;
    generating a read address signal to read from the memory unit; and
    controlling the write address signal and the read address signal so that each start address for writing and reading for each image data is shifted as unit of the memory block and the writing and reading operation are not simultaneously performed to same memory block, each image data having a size being equivalent to one of M blocks (M<N),
    wherein said controlling step replaces a predetermined number of bits from a most significant bit of the read address signal with a predetermined number of revised bits for selecting a memory block to read out the image data and replaces a predetermined number of bits from a most significant bit of the write address signal with a predetermined number of revised bits for selecting a memory block to write the image data.

9. A method according to claim 8, wherein each image data represents an image data for one field or one frame.

10. A method according to claim 9, wherein the image data for one field or one frame, which is written into the memory unit is continuously read two times at a speed twice the speed at writing.

11. A method according to claim 9, wherein the image data for one field or one frame, which is written into the memory unit is continuously read two times at a speed twice the speed at writing to perform a flicker-free signal processing.

12. A method according to claim 9, further comprising the step of:
    performing a certain signal process by obtaining access to the memory block in said memory unit, which is free from said write and read operation.

13. A method according to claim 12, wherein said performing step performs noise reduction processing.

14. A method according to claim 13, wherein said performing step performs said noise reduction processing to a current image data from a input terminal by using previous image data from said memory block which is free from said write and read operation to produce a noise reduced current image data.

* * * * *